(12) United States Patent
Schmitt et al.

(10) Patent No.: US 6,226,602 B1
(45) Date of Patent: May 1, 2001

(54) ELECTRIC CIRCUIT ARRANGEMENT

(75) Inventors: Hans-Walter Schmitt, Bloomfield, MI (US); Claus Schneider, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/081,208

(22) Filed: May 20, 1998

(30) Foreign Application Priority Data

May 22, 1997 (DE) ................................................ 197 21 366

(51) Int. Cl.$^7$ ................................ G06F 11/16; G05F 1/40
(52) U.S. Cl. ........................................... 702/117; 324/503
(58) Field of Search ............................. 702/117; 700/293; 361/86; 340/471, 475, 472, 478, 825.16; 714/724, 734; 315/224; 324/503, 158, 522

(56) References Cited

U.S. PATENT DOCUMENTS

| 5,057,994 | * | 10/1991 | Spiller | 702/117 |
| 5,311,138 | | 5/1994 | Ott el. | 324/503 |
| 5,506,851 | * | 4/1996 | Fuse | 714/724 |
| 5,886,510 | * | 3/1999 | Crespi et al. | 323/273 |

FOREIGN PATENT DOCUMENTS

| 0358972 | 3/1990 | (EP) . |
| 0418665 | 3/1991 | (EP) . |
| 3-017923 | 1/1991 | (JP) . |

* cited by examiner

Primary Examiner—Kamini Shah
(74) Attorney, Agent, or Firm—Walter Ottesen

(57) ABSTRACT

The invention is directed to an electric circuit arrangement (1) for checking a series circuit including a switch (2) and a load (3). The circuit arrangement (1) includes a first circuit (11) which is connected to the connecting circuit node (6) between the switch (2) and the load (3) and is suitable for detecting a first state. The first state defines a short circuit of the connecting circuit node (6) to the supply voltage (5). Furthermore, a second circuit (12) is connected in parallel with the first circuit (11) and is connected to the connecting circuit node (6). The second circuit (12) is suitable for detecting a second or a third state. The second state defines a short circuit of the connecting circuit node (6) to ground (4) and the third state defines an interruption of the connecting circuit node (6) to the supply voltage (5).

13 Claims, 1 Drawing Sheet

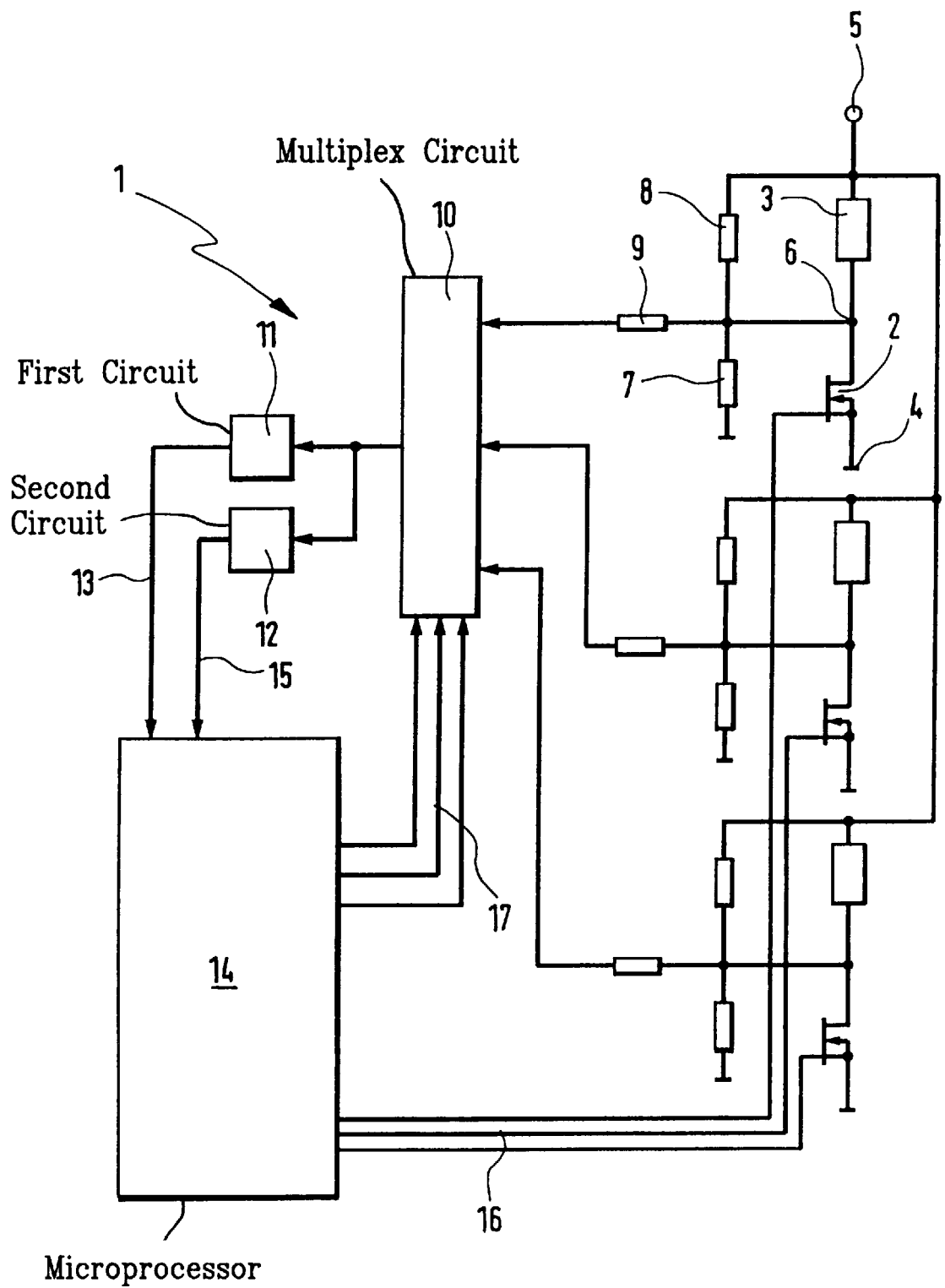

ELECTRIC CIRCUIT ARRANGEMENT

FIELD OF THE INVENTION

The invention relates to an electric circuit arrangement for checking a series circuit which includes a load and a switch. The circuit arrangement includes a first circuit which is connected to the connecting circuit node between the switch and the load. This first circuit is suitable for detecting a first state and this first state defines a short circuit of the connecting circuit node to the supply voltage. The invention also relates to a method for checking a series circuit which includes a switch and a load. In this method, a first state is detected by a first circuit. The first state defines a short circuit of the connecting circuit node of the switch and the load to the supply voltage.

BACKGROUND OF THE INVENTION

A circuit arrangement of this kind is generally known and is often used, for example, in motor vehicles to check the switching in and switching out of a load such as the brake light of the motor vehicle. With the aid of the circuit arrangement, the situation is to be achieved that a fault in the switch, which switches the load in and out, and/or a fault in the load itself is automatically detected.

If, for example, the load is connected to the supply voltage and the switch is connected to ground, then a low potential must be present at the connecting circuit node in a fault-free case wherein the switch is closed. If, in contrast, a high potential is present at the connecting circuit node, this means that a short circuit of the connecting circuit node to the supply voltage is present; that is, the load, for example, has a fault and defines a short circuit. This first state can be clearly detected by the first circuit.

If the switch is open, a high potential must be present at the connecting circuit node in the fault-free case. However, if, for example, the switch is defective and forms a short circuit to ground, or if the connecting cable of the load to the supply voltage is disconnected so that an interruption is present, these two states can be detected in that a low voltage is present at the connecting node when the switch is open. However, the two states cannot be clearly distinguished by the first circuit.

SUMMARY OF THE INVENTION

It is an object of the invention to provide a circuit arrangement and a method of the kind described above with which the above-mentioned fault states can be clearly detected and can be distinguished.

The electric circuit arrangement of the invention is for checking a series circuit connected between a supply voltage and ground. The series circuit includes a load and a switch connected to each other at a circuit node. The electric circuit arrangement includes: a first circuit connected to the circuit node and being configured to detect a first state defined by a short circuit of the circuit node to the supply voltage; a second circuit connected in parallel with the first circuit and connected to the circuit node; the second circuit being configured to detect a second state defined by a short circuit of the circuit node to ground and to detect a third state defined by an interruption of the connection of the circuit node to the supply voltage.

The method of the invention is for checking a series circuit connected between a supply voltage and ground with the series circuit including a load and a switch connected to each other at a circuit node. The method includes the steps of: providing a first circuit connected to the circuit node and detecting a first state with the first circuit and the first state being defined by a short circuit of the circuit node to the supply voltage; providing a second circuit connected to the circuit node and detecting a second state or a third state with the second circuit and the second state being defined by a short circuit of the circuit node to ground and the third state being defined by an interruption of the connection of the circuit node to the supply voltage.

Thus, and according to a feature of the invention, a second circuit is provided, which distinguishes the two states which cannot be clearly distinguished by the first circuit. With this second circuit, the above-mentioned fault states can be clearly detected. The second circuit is connected in parallel with the first circuit. In this way, the first and second circuits can simultaneously detect the states. The fault detection is significantly accelerated in this manner.

In an advantageous embodiment of the invention, a check is first made as to whether the second or the third state can even be present and the detection step with respect to the second or the third state is only executed when this is the case. Stated otherwise, this means that the detection step, which is executed by the second circuit, is only utilized when a previous check has shown that the second or the third state can even be present at all. If the detection step, which is executed by the second circuit, is very time intensive with respect to the second or third states, then the entire fault detection can be further accelerated via a rapid advance check. Only when the second or the third state can even be present, is it necessary that the time-intensive detection step with respect thereto must be awaited; otherwise, the fault detection can already be completed in advance of the time-intensive detection step.

It is especially purposeful when the check is executed by the first circuit. This affords the advantage that, for the check, no additional components or the like are required. Furthermore, the entire fault detection is further accelerated with a rapidly operating first circuit.

In an advantageous further embodiment of the invention, the first circuit has a digital circuit which is suited to distinguish a high potential and a low potential from each other at the connecting circuit node. If a high potential is detected by the first circuit, then, for a closed switch, and as already explained, the first state is present, that is, for example, a short circuit via the load to the supply voltage. If, in contrast, the first circuit detects a low potential, then, for an open switch, and as explained above, either a short circuit to ground or an interruption to the load or supply voltage is present. This last result defines either the second or third state between which the first circuit, however, cannot clearly distinguish. The result can, however, be utilized as a test as to whether the second or third states can even be present. In total, and with the aid of the digital circuit according to the invention, the first state can be clearly detected on the one hand, as well as making a decision on the other hand, as to whether the second or the third states can even be present and, whether the result of the second circuit must therefore even be evaluated.

In a further advantageous embodiment of the invention, the second circuit includes an analog circuit which is suitable to distinguish a mid potential and a low potential from each other at the connecting circuit node. As already explained, a high potential must be present at the connecting circuit node for an open switch in the fault-free case. If a low potential is detected by the second circuit for an open switch, then a short circuit of the connecting circuit node to ground is present, for example, because of a defect of the switch. This is the second state. However, if a mid potential is detected by the second circuit for an open switch, then an interruption of the connecting circuit node to the supply voltage is present, for example, because there is an interruption of the cable connection from the load to the supply voltage. This is third state. With the aid of the analog circuit of the invention, the second and third states can be clearly detected in this way.

It is especially purposeful when the first circuit and the second circuit are connected at their output ends to a microprocessor and when the switch is switchable on and off by the microprocessor. In this way, all necessary data to detect the first or second or third state are present in the microprocessor. Likewise, the result of the fault detection, which is executed by the microprocessor, is present in digital form and can therefore be further used without additional complexity in other open-loop or closed-loop controls. Furthermore, the entire fault detection is further accelerated because of the use of the microprocessor.

The switch switches to ground in the circuit arrangement described above. It is, however, possible that the switch is switched to the supply voltage. In the last-mentioned case, the described states must be correspondingly exchanged.

BRIEF DESCRIPTION OF THE DRAWINGS

The invention will now be described with reference to the single FIGURE of the drawing (FIG. 1) which shows a schematic of an embodiment of the electric circuit arrangement of the invention.

DESCRIPTION OF THE PREFERRED EMBODIMENTS OF THE INVENTION

FIG. 1 shows an electric circuit arrangement 1 of the invention for checking a series circuit including a switch 2 and a load 3.

In the circuit arrangement 1, the switch 2 is connected to ground and the load 3 is connected to the supply voltage 5. The switch 2 can, for example, be an electronic component such as a transistor. The load 3 can be a consumer such as a consumer for a motor vehicle. The connecting circuit node between the switch 2 and the load 3 is identified by reference numeral 6. The circuit node 6 is connected via a resistor 7 to ground 4 and via resistor 8 to the supply voltage 5. The resistors 7 and 8 define a voltage divider. Furthermore, the circuit node 6 is connected via a resistor 9 to an input of a multiplex circuit 10.

The multiplex circuit 10 includes additional inputs at which additional series circuits having corresponding resistors can be connected. The series circuits each comprise a switch and a load. In FIG. 1, two such additional series circuits are shown as an example. A detailed description with respect to these additional series circuits is not provided because they are identical to the series circuit described above.

One output of the multiplex circuit 10 is connected to a first digital circuit 11 and a second analog circuit 12. The first and second circuits (11, 12) are connected in parallel with each other. The first circuit 11 is adapted to distinguish a high potential and a low potential from each other at connecting node 6. The second circuit 12 is adapted to distinguish a high potential, a mid potential and a low potential from each other at connecting circuit node 6.

The first digital circuit 11 is connected via a 1 bit wide line 13 to a microprocessor 14. The second analog circuit is connected via a line 15 likewise to the microprocessor 14. Control line 16 leads from the microprocessor 14 to the switch 2 and control line 17 leads from the microprocessor 14 to the multiplex circuit 10.

If, in a fault-free state, the switch 2 is closed by the microprocessor 14 (thus, the transistor is, for example, switched into its conducting state), then a low potential is present at the circuit node 6. This low potential is detected by the first digital circuit 11 and is, for example, transmitted by a digital "0" to the microprocessor 14. The microprocessor 14 detects that no fault is present based on the switching state of the switch 2 and the received information with respect to the low potential.

However, if, for example, for a closed switch 2, the load 3 is defective and a short circuit to the supply voltage 5 is formed, then the first digital circuit 11 detects a high potential at the circuit node 6. This would, for example, be transmitted to the microprocessor 14 by means of a digital "1". The microprocessor 14 would then conclude that a fault is present based on the switching state of the switch 2 and the received information with respect to the high potential. The fault defines a first state of the circuit arrangement 1 wherein a short circuit of the circuit node 6 to the supply voltage 5 is present.

The second circuit 12 does not participate in the detection of the above-mentioned first state.

If, in the fault-free state, the switch 2 is opened by the microprocessor 14 (that is, for example, the transistor is switched into its blocking state), then a high potential is present at the circuit node 6. This high potential is detected by the first digital circuit 11 and, for example, is transmitted to the microprocessor 14 via a digital "1". The microprocessor 14 detects that no fault is present based on the switching state of the switch 2 and the received information.

In the case of a fault, the first digital circuit 11 detects a low potential at the connecting node 6 for an open switch 2. This is, for example, transmitted to the microprocessor 14 by a digital "0". The microprocessor 14 concludes a fault as present based on the switching state of the switch 2 and the received information with respect to the low potential. The fault can correspond to a second or to a third state of the circuit arrangement 1, namely, for the second state, a short circuit of the circuit node 6 to ground 4 or, for the third state, an interruption of the circuit node 6 to the supply voltage.

The microprocessor 14 is not in the position to decide as to which of the two states is actually present based on the information received from the first digital circuit 11. From the information received, the microprocessor 14 can, however, conclude that a fault in the form of at least one of the two states must be present. In this context, the data received by the first digital circuit 11 from the microprocessor 14 can be viewed at least as a check as to whether the second or the third state can even be present.

If this is the case, then a fault is present based on the data of the first digital circuit 11 and this fault is in the form of either the second state or the third state. The microprocessor 14 then uses the data received from the second analog circuit 12 for further fault detection.

If a low potential is detected by the second analog circuit 12 for the open switch 2, then a short circuit of the circuit node 6 to ground 4 is present, for example, because of a defect of switch 2. In this case, the circuit arrangement 1 is therefore in the second state.

If, however, a mid potential is detected by the second analog circuit 12, then an interruption of the circuit node 6 to the supply voltage 5 is present, for example, because of a loosening of the connecting cable from the load 3 to the supply voltage 5. In this case, the circuit arrangement 1 is therefore in the third state.

The first digital circuit 11 conventionally operates more rapidly than the second analog circuit 12. The microprocessor 14 must only then wait for the data of the second analog circuit 12, which is available later, when, based on the data of the first digital circuit 11, the actual state of the circuit arrangement 1 is not clearly detected. In many cases, the state of the circuit arrangement 1 can be detected solely with the aid of the first digital circuit 11 and therefore very rapidly. Only in the few remaining cases must the microprocessor 14 wait for the data of the second analog circuit 12 in order to reach a final and clear detection of the state of the circuit arrangement 1.

With the aid of the multiplex circuit 10, the microprocessor 14 can sequentially execute fault detections for the other series circuits shown in FIG. 1 in a corresponding manner and, in each case, detect the particular state.

It is understood that the foregoing description is that of the preferred embodiments of the invention and that various changes and modifications may be made thereto without departing from the spirit and scope of the invention as defined in the appended claims.

What is claimed is:

1. An electric circuit arrangement for making electrical checks at a circuit node of a series circuit connected between a supply voltage and ground, the series circuit including a load and a switch connected to each other at said circuit node, the electric circuit arrangement comprising:

a first circuit connected to said circuit node and being configured to detect a first state at said circuit node defined by a short circuit of said circuit node to said supply voltage;

a second circuit connected in parallel with said first circuit and connected to said circuit node;

said second circuit being configured to detect a second state at said circuit node defined by a short circuit of said circuit node to ground and to detect a third state at said circuit node defined by an interruption of the connection of said circuit node to said supply voltage.

2. The electric circuit arrangement of claim 1, said first circuit being a digital circuit functioning to distinguish a high potential and a low potential at said circuit node from each other.

3. The electric circuit arrangement of claim 2, said digital circuit having an output 1 bit wide.

4. The electric circuit arrangement of claim 2, said second circuit being an analog circuit functioning to distinguish a mid potential and a low potential at said circuit node from each other.

5. The electric circuit arrangement of claim 4, said analog circuit having a voltage divider.

6. The electric circuit arrangement of claim 4, further comprising a microprocessor; and, said first and second circuits having respective outputs connected to said microprocessor.

7. The electric circuit arrangement of claim 6, said microprocessor being connected to said switch and functioning to switch said switch on and off.

8. The electric circuit arrangement of claim 6, further comprising a plurality of said series circuits and a multiplex circuit for connecting each of said series circuits to said first and second circuits.

9. The electric circuit arrangement of claim 8, said multiplex circuit having an input connected to said microprocessor.

10. The electric circuit arrangement of claim 1, said switch being switchable to connect to ground or to said supply voltage.

11. A method for making electrical checks at a circuit node of a series circuit connected between a supply voltage and ground, the series circuit including a load and a switch connected to each other at said circuit node, the method comprising the steps of:

providing a first circuit connected to said circuit node and detecting a first state at said circuit node with said first circuit and said first state being defined by a short circuit of said circuit node to said supply voltage;

providing a second circuit connected to said circuit node and detecting a second state at said circuit node or a third state at said circuit node with said second circuit and said second state being defined by a short circuit of said circuit node to ground and said third state being defined by an interruption of the connection of said circuit node to said supply voltage.

12. The method of claim 11, comprising the further steps of:

first checking to determine if said second and third states can even be present; and, if so, then detecting whether said second state or said third state is present.

13. The method of claim 12, wherein the check utilizing said first circuit is carried out.

* * * * *